US009829661B2

(12) United States Patent
Pinguet et al.

(10) Patent No.: US 9,829,661 B2
(45) Date of Patent: *Nov. 28, 2017

(54) METHOD AND SYSTEM FOR HYBRID INTEGRATION OF OPTICAL COMMUNICATION SYSTEMS

(71) Applicant: Luxtera, Inc., Carlsbad, CA (US)

(72) Inventors: Thierry Pinguet, Vashon, WA (US); Sherif Abdalla, Carlsbad, CA (US); Mark Peterson, San Diego, CA (US); Gianlorenzo Masini, Carlsbad, CA (US); Peter DeDobbelaere, San Diego, CA (US)

(73) Assignee: Luxtera, Inc., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/487,770

(22) Filed: Apr. 14, 2017

(65) Prior Publication Data

US 2017/0219785 A1   Aug. 3, 2017

Related U.S. Application Data

(63) Continuation of application No. 15/144,611, filed on May 2, 2016, now Pat. No. 9,625,665, which is a (Continued)

(51) Int. Cl.
*H04B 10/00* (2013.01)
*H04B 10/06* (2006.01)
(Continued)

(52) U.S. Cl.
CPC ......... *G02B 6/428* (2013.01); *G02B 6/12004* (2013.01); *G02B 6/34* (2013.01);
(Continued)

(58) Field of Classification Search
USPC ............ 257/25; 398/115, 159, 124; 438/700
See application file for complete search history.

(56) References Cited

U.S. PATENT DOCUMENTS

| 7,027,673 | B1 * | 4/2006 | Gunn, III | ............... | G02B 6/105 |
| | | | | | 385/11 |
| 7,162,124 | B1 * | 1/2007 | Gunn, III | ................ | G02B 6/30 |
| | | | | | 385/27 |

(Continued)

OTHER PUBLICATIONS

European Patent Office, extended European search report in application No. 13179442.2 dated May 8, 2015 (6 pages).

(Continued)

*Primary Examiner* — David Payne
*Assistant Examiner* — Pranesh Barua
(74) *Attorney, Agent, or Firm* — McAndrews, Held & Malloy

(57) ABSTRACT

Methods and systems for hybrid integration of optical communication systems are disclosed and may include receiving continuous wave (CW) optical signals in a silicon photonics die (SPD) from an optical source external to the SPD. The received CW optical signals may be processed based on electrical signals received from an electronics die bonded to the SPD via metal interconnects. Modulated optical signals may be received in the SPD from optical fibers coupled to the SPD. Electrical signals may be generated in the SPD based on the received modulated optical signals and communicated to the electronics die via the metal interconnects. The CW optical signals may be received from an optical source assembly coupled to the SPD and/or from one or more optical fibers coupled to the SPD. The received CW optical signals may be processed utilizing one or more optical modulators, which may comprise Mach-Zehnder interferometer modulators.

20 Claims, 9 Drawing Sheets

Related U.S. Application Data continuation of application No. 13/568,406, filed on Aug. 7, 2012, now Pat. No. 9,331,096, which is a continuation-in-part of application No. 12/554,449, filed on Sep. 4, 2009, now Pat. No. 8,877,616.

(51) Int. Cl.

| | |
|---|---|
| *H01L 29/06* | (2006.01) |
| *H01L 21/311* | (2006.01) |
| *G02B 6/42* | (2006.01) |
| *G02F 1/225* | (2006.01) |
| *G02B 6/12* | (2006.01) |
| *G02B 6/34* | (2006.01) |
| *H04B 10/27* | (2013.01) |
| *G02F 1/21* | (2006.01) |

(52) U.S. Cl.
CPC ........... *G02F 1/2257* (2013.01); *H04B 10/27* (2013.01); *G02F 2001/212* (2013.01)

(56) References Cited

U.S. PATENT DOCUMENTS

| | | | | |
|---|---|---|---|---|
| 8,320,767 | B2* | 11/2012 | Morris | H04B 10/803 398/103 |
| 8,457,454 | B1* | 6/2013 | Roy | G02B 6/428 385/129 |
| 8,546,955 | B1* | 10/2013 | Wu | H01L 23/5384 257/686 |
| 2003/0109142 | A1* | 6/2003 | Cable | G02B 6/4231 438/708 |
| 2004/0114853 | A1 | 6/2004 | Bjorkman | |
| 2004/0241892 | A1* | 12/2004 | Colgan | G02B 6/43 438/22 |
| 2005/0205930 | A1 | 9/2005 | Williams | |
| 2006/0008223 | A1* | 1/2006 | Gunn | G02F 1/025 385/129 |
| 2006/0038168 | A1* | 2/2006 | Estes | B82Y 10/00 257/25 |
| 2007/0080414 | A1 | 4/2007 | Bjorkman | |
| 2008/0099928 | A1* | 5/2008 | Lee | H01L 21/563 257/781 |
| 2009/0022500 | A1* | 1/2009 | Pinguet | G02B 6/1228 398/164 |
| 2009/0103855 | A1* | 4/2009 | Binkert | G02B 6/43 385/14 |
| 2009/0294814 | A1 | 12/2009 | Assefa | |
| 2010/0056409 | A1* | 3/2010 | Walker | C11D 7/06 510/175 |
| 2010/0060972 | A1* | 3/2010 | Kucharski | G02F 1/225 359/290 |
| 2011/0133281 | A1 | 6/2011 | Assefa et al. | |
| 2012/0177381 | A1* | 7/2012 | Dobbelaere | H01L 21/84 398/139 |
| 2013/0207127 | A1* | 8/2013 | Yu | H01L 25/167 257/82 |
| 2014/0369693 | A1 | 12/2014 | Peterson et al. | |

OTHER PUBLICATIONS

Continuous-wave modulation, pp. 1-9.
R. Muller, P. Obreja, V. Banu, I. Pavelescu, and D. Dascalu, Silicon-compatible waveguides used for an integrated opto-mechanical pressure sensor, Optical Materials 17 (2001, Elsevier Science B.V.),National Institute for R&D in Microtechnolgies, P.O. Box 36-160,72225, Bucharest, Romania, 255-258.
European Patent Office, Communication extended European search report, pursuant to Rule 62 EPC, the supplementary European search report, and extended search opinion, copies of documents cited in the ESR, No. EP09812368.0 dated Mar. 6, 2013 (7 pages). EPO Form 1703 01.91TRI, cf Form 1507, Application No. 09 812 368.0, dated Mar. 5, 2011, pp. 1-6.
Attila Mekis et al: "Monolithic integration of photonic and electronic circuits in a CMOS process", Proceedings of SPIE, SPIE—International Society for Optical Engineering US, vol. 6897, Feb. 12, 2008 (2008-02-689970L-1, KP008144363, ISSN: 0277-766X, DOI: 10.1117/12.766815.
Weiquan Zhang et al.: "Building hybrid active pixels for CMOS imager on SOI Substrate", SOI Conference, 1999. Proceedings. 1999 IEEE International Rohnert Park, CA, USA Oct. 4-7, 1999, Piscataway, NJ, USA IEEE, pp. 102-103, XP010370234, DOI: 10.1109/SOI.1999.819873, ISBN: 978-0-7803-5456-2.
Graham T. Reed and Andrew P. Knights, "Silicon Photonics an Introduction", John Wiley & Sons Ltd, The Atrium, Southern Gate, Chichester, West Sussex PO19 SSQ, England, Copyright 2004, pp. 1-255.
The State Intellectual Property Office of the People's Republic of China, Notification of the First Office Action and Search Report, Application No. 2013103421968, Applicant: Luxtera, Inc., Date of Issue: Jan. 22, 2017, pp. 1-6.
PCT/US2009/056213, Mar. 11, 2009, R. Muller, P. Obreja, V. Banu, I. Pavelescu, and D. Dascalu, Silicon-compatible waveguides used for an integrated opto-mechanical pressure sensor, Optical Materials 17 (2001, Elsevier Science B.V.),National Institute for R&D in Microtechnolgies, P.O. Box 36-160,72225, Bucharest, Romania, Invited Paper, pp. 1-18.

\* cited by examiner

METHOD AND SYSTEM FOR HYBRID INTEGRATION OF OPTICAL COMMUNICATION SYSTEMS

CROSS-REFERENCE TO RELATED APPLICATIONS/INCORPORATION BY REFERENCE

This application is a continuation of U.S. application Ser. No. 15/144,611 filed on May 2, 2016, which is a continuation of U.S. application Ser. No. 13/568,406 filed on Aug. 7, 2012 now U.S. Pat. No. 9,331,096, which is a continuation-in-part of U.S. application Ser. No. 12/554,449 filed on Sep. 4, 2009, now U.S. Pat. No. 8,877,616. This application also makes reference to U.S. application Ser. No. 13/422,776, filed on Mar. 6, 2012.

Each of the above cited references is hereby incorporated by reference in its entirety.

FIELD OF THE INVENTION

Certain embodiments of the invention relate to semiconductor processing. More specifically, certain embodiments of the invention relate to a method and system for hybrid integration of optical communication systems.

BACKGROUND OF THE INVENTION

As data networks scale to meet ever-increasing bandwidth requirements, the shortcomings of copper data channels are becoming apparent. Signal attenuation and crosstalk due to radiated electromagnetic energy are the main impediments encountered by designers of such systems. They can be mitigated to some extent with equalization, coding, and shielding, but these techniques require considerable power, complexity, and cable bulk penalties while offering only modest improvements in reach and very limited scalability. Free of such channel limitations, optical communication has been recognized as the successor to copper links.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for hybrid integration of optical communication systems, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for hybrid integration of optical communication systems. Exemplary aspects of the invention may comprise receiving one or more continuous wave (CW) optical signals in a silicon photonics die from an optical source external to the photonics die. The one or more received CW optical signals may be processed based on electrical signals received from one or more electronics die bonded to the silicon photonics die via metal interconnects, which may comprise copper pillars, for example. Modulated optical signals may be received in the silicon photonics die from one or more optical fibers coupled to the silicon photonics die. Electrical signals may be generated in the silicon photonics die based on the received modulated optical signals and communicated to the one or more electronics die via the metal interconnects. The metal interconnects may comprise copper pillars. The one or more CW optical signals may be received from an optical source assembly coupled to the silicon photonics die and/or from one or more optical fibers coupled to the silicon photonics die. The one or more received CW optical signals may be processed utilizing one or more optical modulators, which may comprise Mach-Zehnder interferometer modulators. The electrical signals may be generated in the silicon photonics die utilizing one or more photodetectors integrated in the silicon photonics die. The optical signals may be communicated into and/or out of the silicon photonics die utilizing grating couplers. The optical source may comprise one or more semiconductor lasers. The hybrid integration optical communication system may comprise a plurality of transceivers.

Figure 1:
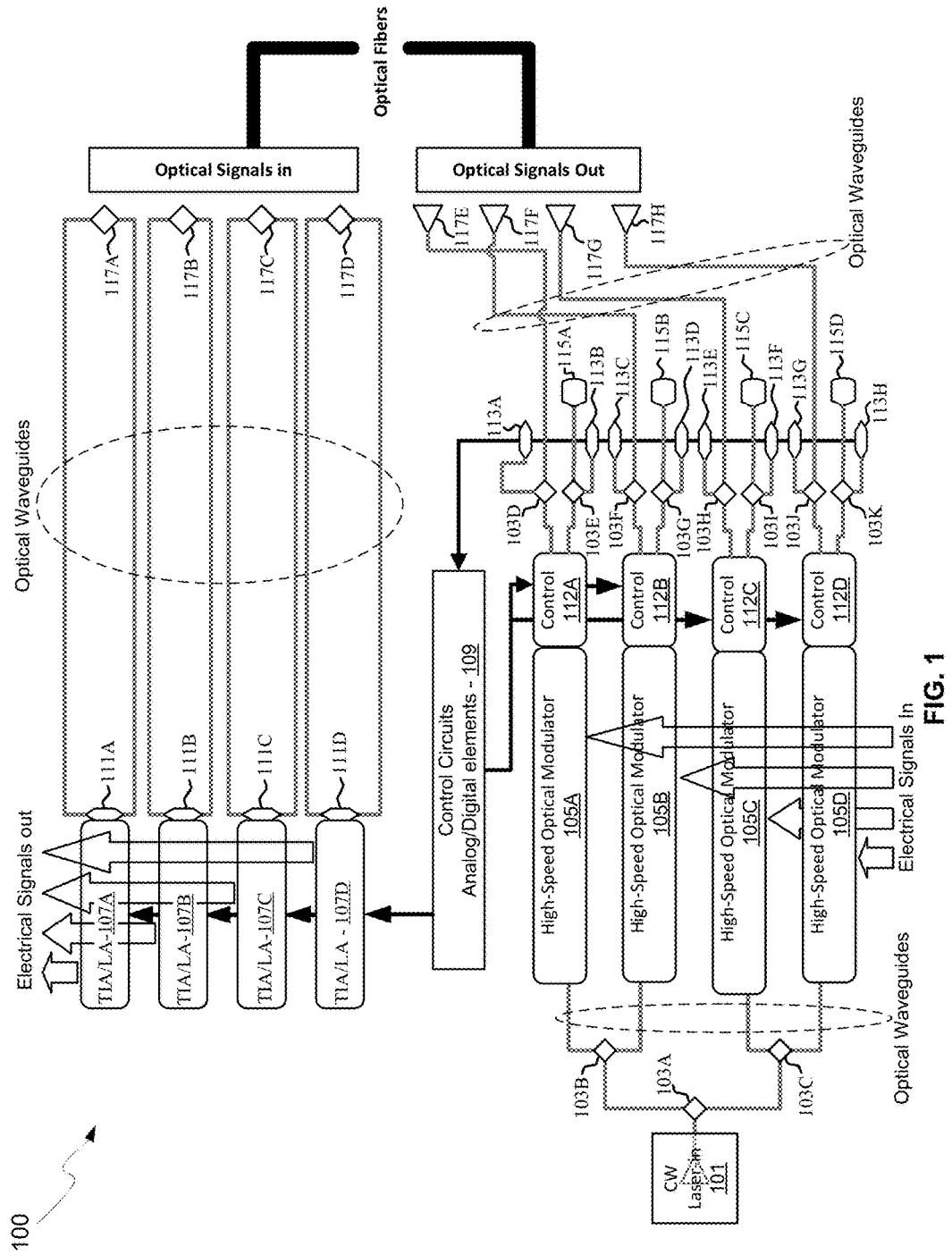
FIG. 1 is a block diagram of a photonic transceiver, in accordance with an embodiment of the invention.

FIG. 1 is a block diagram of a photonic transceiver, in accordance with an embodiment of the invention. Referring to FIG. 1, there is shown optoelectronic devices in a transceiver 100 comprising high speed optical modulators 105A-105D, high-speed photodiodes 111A-111D, monitor photodiodes 113A-113H, and optical devices comprising taps 103A-103K, optical terminations 115A-115D, and grating couplers 117A-117H. There are also shown electrical devices and circuits comprising transimpedance and limiting amplifiers (TIA/LAs) 107A-107E, analog and digital control circuits 109, and control sections 112A-112D. Optical signals are communicated between optical and optoelectronic devices via optical waveguides fabricated in a photonics chip. Additionally, optical waveguides are indicated in FIG. 1 by the dashed ovals.

The high speed optical modulators 105A-105D comprise Mach-Zehnder or ring modulators, for example, and enable the modulation of the CW laser input signal. The high speed optical modulators 105A-105D are controlled by the control sections 112A-112D, and the outputs of the modulators are optically coupled via waveguides to the grating couplers 117E-117H. Exemplary modulation techniques comprise amplitude shift keying (ASK), binary phase shift keying (BPSK), pulse amplitude modulation (PAM), quadrature amplitude modulation (QAM), quadrature phase shift keying (QPSK), and dual polarization quadrature phase shift keying (DP-QPSK). The taps 103D-103K comprise four-port optical couplers, for example, and are utilized to sample the optical signals generated by the high speed optical modulators 105A-105D, with the sampled signals being measured by the monitor photodiodes 113A-113H. The unused branches of the taps 103D-103K are terminated by optical terminations 115A-115D to avoid back reflections of unwanted signals.

The grating couplers 117A-117H comprise optical gratings that enable coupling of light into and out of the chip. The grating couplers 117A-117D are utilized to couple light received from optical fibers into the chip, and may comprise polarization independent grating couplers. The grating couplers 117E-117H are utilized to couple light from the chip into optical fibers. The optical fibers may be epoxied, for example, to the chip, and may be aligned at an angle from normal to the surface of the chip to optimize coupling efficiency.

The high-speed photodiodes 111A-111D convert optical signals received from the grating couplers 117A-117D into electrical signals that are communicated to the TIA/LAs 107A-107D for processing. The analog and digital control circuits 109 may control gain levels or other parameters in the operation of the TIA/LAs 107A-107D. The TIA/LAs 107A-107D, the analog and digital control circuits 109, and the control sections 112A-112D may be integrated on an electronics chip that may be bonded to the silicon photonics chip via metal interconnects. In an exemplary scenario, the metal interconnects may comprise copper pillars. In this manner, electronic and photonic performance may be optimized independently on different fabrication technology platforms. In an exemplary scenario, the electronics die may comprise CMOS die, but the invention is not so limited. Accordingly, any semiconductor technology may be utilized to fabricate the electronic die, such as CMOS, Bi-COMS, SiGe, or III-V processes. The TIA/LAs 107A-107D may then communicate electrical signals to other circuitry on the electronics chip.

The TIA/LAs 107A-107D may comprise narrowband, non-linear optoelectronic receiver circuitry. Accordingly, the narrowband receiver front-end may be followed by a restorer circuit, such as, for example, a non-return to zero (NRZ) level restorer circuit. A restorer circuit limits the bandwidth of the optical receiver in order to decrease the integrated noise, thereby increasing the signal to noise ratio. An NRZ level restorer may be used to convert the resulting data pulses back into NRZ data.

The control sections 112A-112D comprise electronic circuitry that enable modulation of the CW laser signal received from the taps 103A-103C. The high speed optical modulators 105A-105D require high-speed electrical signals to modulate the refractive index in respective branches of a Mach-Zehnder interferometer (MZI), for example.

In an embodiment of the invention, the integration of all optical and optoelectronic devices required for a transceiver into a single silicon photonics chip, and of all required electronic devices on one or more electronics chips, enables optimized performance of the resulting single hybrid package. In this manner, electronic device performance may be optimized independently of the optimization of photonic devices in the silicon photonic chip. For example, the electronics chip may be optimized on a 32 nm CMOS process, while the photonics chip may be optimized on a 130 nm CMOS node. Additionally, the electronics or photonics chips may be fabricated utilizing technologies other than CMOS, such as SiGe or bipolar-CMOS (Bi-CMOS). The electronics devices may be placed on the electronics chip such that they are located directly above their associated photonics devices when bonded to the photonics chip. For example, the control sections 112A-112D may be located on the electronics chip such that they lie directly above the high-speed optical modulators 105A-105B and can be coupled by low parasitic copper pillars.

In an exemplary embodiment, the hybrid transceiver 100 comprises four optoelectronic transceivers with one optical source, and enables communication of optical signals vertically to and from the surface of the photonics chip, thereby enabling in an exemplary embodiment, the use of CMOS processes and structures, including a CMOS guard ring. The photonics chip may comprise both active devices, such as photodetectors and modulators, and passive devices, such as waveguides, splitters, combiners, and grating couplers, thereby enabling photonic circuits to be integrated on silicon chips.

Figure 2A:
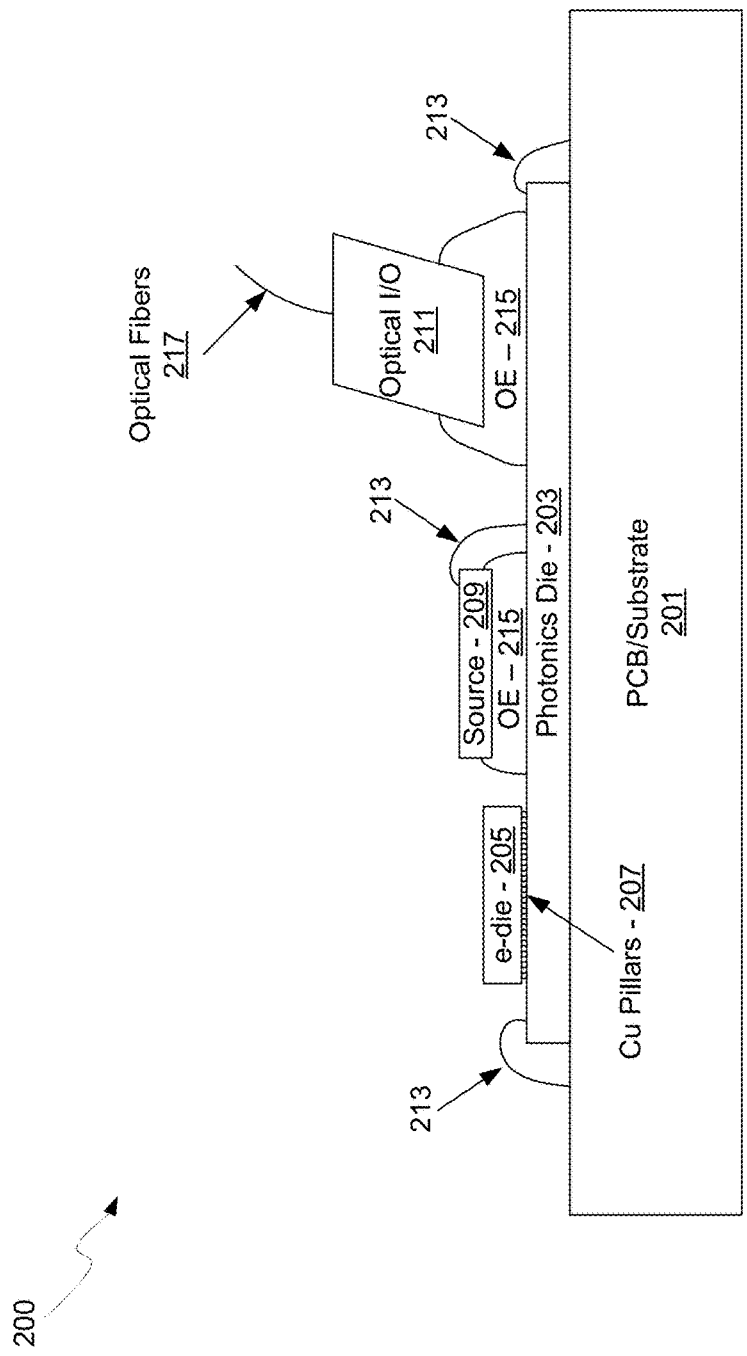
FIG. 2A is a schematic illustrating an exemplary hybrid integration photonic transceiver, in accordance with an embodiment of the invention.

FIG. 2A is a schematic illustrating an exemplary hybrid integration photonic transceiver, in accordance with an embodiment of the invention. Referring to FIG. 2A, there is shown a hybrid integration photonic transceiver 200 comprising a printed circuit board (PCB)/substrate 201, a photonic CMOS die 203, an electronic CMOS die 205, metal interconnects 207, an optical source module 209, an optical input/output (I/O) 211, wire bonds 213, optical epoxy 215, and optical fibers 217.

The PCB/substrate 201 may comprise a support structure for the transceiver 200, and may comprise both insulating and conductive material for isolating devices as well as providing electrical contact for active devices on the photonics die 203 as well as to devices on the electronics die 205 via the photonics die 203. In addition, the PCB/substrate may provide a thermally conductive path to carry away heat generated by devices and circuits in the electronics die 205 and the optical source module 209.

The photonics die 203 may comprise a silicon chip with active and passive optical devices such as waveguides, modulators, photodetectors, grating couplers, taps, and combiners, for example. The photonics die 203 may also comprise metal interconnects 207 for coupling the electronics die 205 to the photonics die 203, as well as grating couplers for coupling light into the die from the optical source module 209 and into/out of the die via the optical I/O 211. In addition, the photonics die 203 may comprise through-substrate-vias (TSVs), not shown, for electrical interconnection through the die, such as between the PCB/substrate 201 and the electronics die 205. Optical interfaces may also be facilitated by the optical epoxy 215, providing both optical transparency and mechanical fixation.

The electronics die 205 may comprise a chip that provides all the required electronic functions of the photonic transceiver 200. The electronics die 205 may comprise a single chip or a plurality of die coupled to the photonics chip 203 via the metal interconnects 207. The electronics die 205 may comprise TIA's, LNAs, and control circuits for processing optical signals in the photonics chip 203. For example, the electronics die 205 may comprise driver circuitry for controlling optical modulators in the photonics die 203 and variable gain amplifiers for amplifying electrical signals received from photodetectors in the photonics die 203. By incorporating photonics devices in the photonics die 203 and electronic devices in the electronics die 205, the processes for each chip may be optimized for the type of devices incorporated.

The metal interconnects 207 may comprise linear or 2D arrays of metal pillars, for example, to provide electrical contact between the photonics die 203 and the electronics die 205. In an exemplary scenario, the metal interconnects 207 may comprise copper pillars, or any other suitable metal for semiconductor contacts, such as stud bumps or solder bumps. Accordingly, the metal interconnects 207 may provide electrical contact between photodetectors in the photonics die 203 and associated receiver circuitry in the electronics die 205. In addition, the metal interconnects 207 may provide mechanical coupling of the electronics and photonics die, and may be encapsulated with underfill to protect the metal and other surfaces.

The optical source module 209 may comprise an assembly with an optical source, such as a semiconductor laser, and associated optical elements to direct one or more optical signals into the photonics die 203. An example of the optical source module is described in U.S. patent application Ser. No. 12/500,465 filed on Jul. 9, 2009, which is hereby incorporated in its entirety. In another exemplary scenario, the optical signal or signals from the optical source assembly 209 may be coupled into the photonics die 203 via optical fibers affixed above grating couplers in the photonics die 203.

The optical I/O 211 may comprise an assembly for coupling the optical fibers 217 to the photonics die 203. Accordingly, the optical I/O 211 may comprise mechanical support for one or more optical fibers and an optical surface to be coupled to the photonics die 203, such as by the optical epoxy 215.

In operation, continuous-wave (CW) optical signals may be communicated into the photonics die 203 from the optical source module 209 via one or more grating couplers in the photonics die 203. Photonic devices in the photonics die 203 may then process the received optical signal. For example, one or more optical modulators may modulate the CW signal based on electrical signals received from the electronics die 205. Electrical signals may be received from the electronics die 205 via the metal interconnects 207. By integrating modulators in the photonics die 203 directly beneath the source of the electrical signals in the electronics die 205, signal path lengths may be minimized, resulting in very high speed performance. For example, utilizing metal pillars with <20 fF capacitance, speeds of 50 GHz and higher can be achieved.

The modulated optical signals may then be communicated out of the photonics die 203 via grating couplers situated beneath the optical I/O 211. In this manner, high-speed electrical signals generated in the electronics die 205 may be utilized to modulate a CW optical signal and subsequently communicated out of the photonics die 203 via the optical fibers 217.

Similarly, modulated optical signals may be received in the photonics die 203 via the optical fibers 217 and the optical I/O 211. The received optical signals may be communicated within the photonics die 203 via optical waveguides to one or more photodetectors integrated in the photonics die 203. The photodetectors may be integrated in the photonics die 203 such that they lie directly beneath the associated receiver electronics circuitry in the electronics die 205 when bonded and electrically coupled by the low parasitic capacitance metal interconnects 207.

The hybrid integration of electronics die on photonic die via metal interconnects enables very high speed optical transceivers utilizing standard semiconductor processes, such as CMOS, Bi-CMOS, or Si—Ge. In addition, integrating separate photonic and electronic die enables the independent optimization of the performance of electronic and photonic functions within the respective semiconductor processes.

Figure 2B:
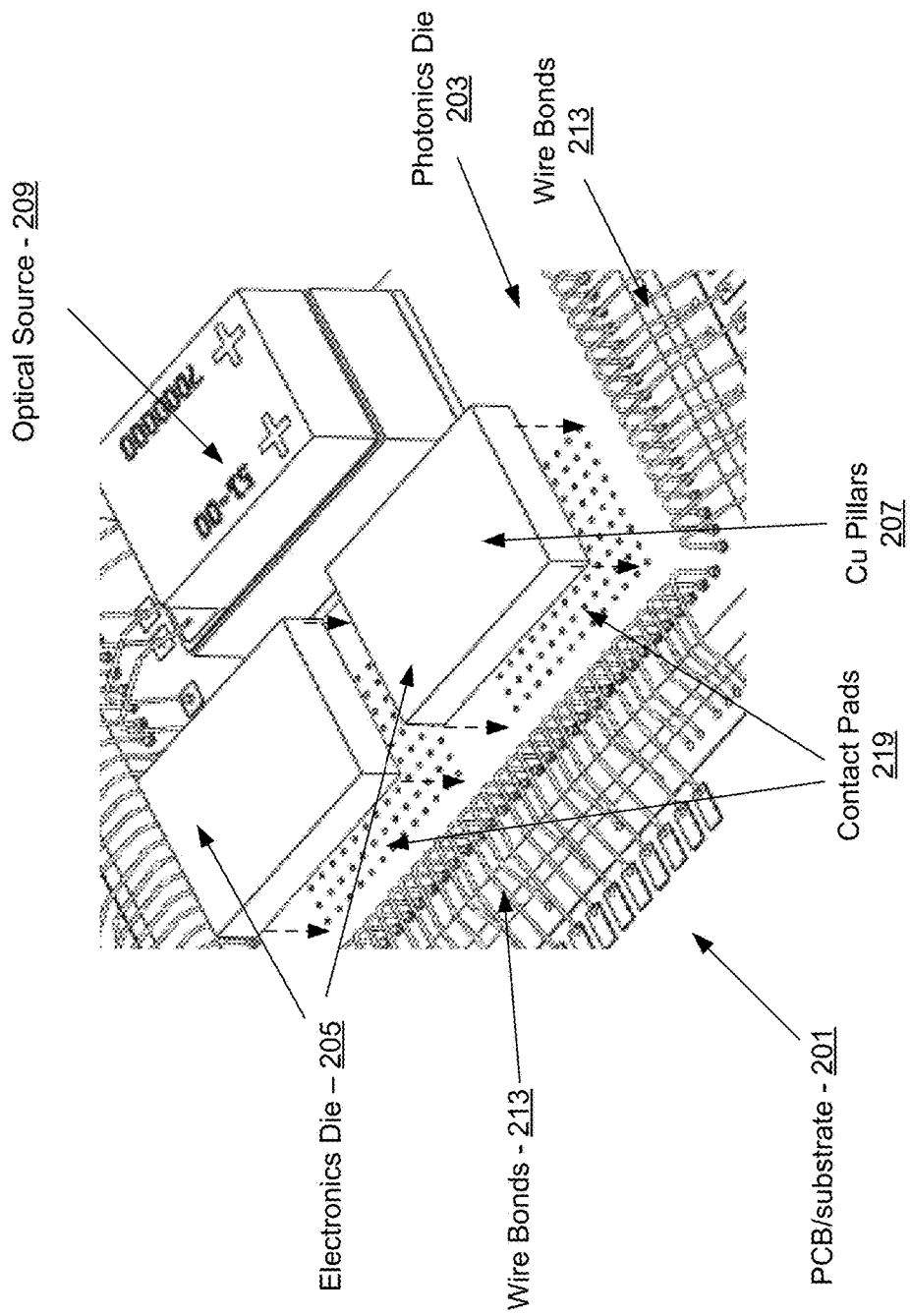
FIG. 2B is a perspective view of a hybrid integration photonic transceiver, in accordance with an embodiment of the invention.

FIG. 2B is a perspective view of a hybrid integration photonic transceiver, in accordance with an embodiment of the invention. Referring to FIG. 2B, there is shown the PCB/substrate 201, the photonics die 203, electronics die 205, the metal interconnects 207, the optical source assembly 209, and wire bonds 213.

The electronics die 205 are shown prior to bonding to the surface of the photonics die 203 via the metal interconnects 207, as illustrated by the dashed arrows below each die. While two electronics die 205 are shown in FIG. 2B, it should be noted that the invention is not so limited. Accordingly, any number of electronics die may be coupled to the photonics die 203 depending on number of transceivers, the particular semiconductor process node utilized, thermal conductance, and space limitations, for example.

In an exemplary embodiment, electronic functions may be integrated into the electronics die 205 and photonics circuitry may be integrated into the photonics die 203 utilizing independent semiconductor processes. The electronics die 205 may comprise electronic devices associated with photonic devices in the photonics die 203, thereby minimizing electrical path lengths while still allowing independent performance optimization of electronic and photonic devices. For example, a CMOS process that results in the highest electronics performance, such as the fastest switching speed, may not be optimum for photonics performance. Similarly, different technologies may be incorporated in the different die. For example, SiGe processes may be used for photonic devices such as photodetectors, and 32 nm CMOS process, or even a SiGe or Bi-CMOS process, may be used for electronic devices on the electronics die 205.

The photonics die 203 may comprise photonic circuits, whereby optical signals may be received, processed, and transmitted out of the photonics die 203. The optical source assembly 209 may provide a CW optical signal to the photonics die 203, with the photonics circuitry in the photonics die 203 processing the CW signal. For example, the CW signal may be coupled into the photonics die 203 via grating couplers, communicated to various locations on the die via optical waveguides, modulated by Mach-Zehnder interferometer (MZI) modulators, and communicated out of the photonics die 203 into optical fibers. In this manner, the hybrid integration of a plurality of high performance optical transceivers is enabled in semiconductor processes.

Figure 2C:
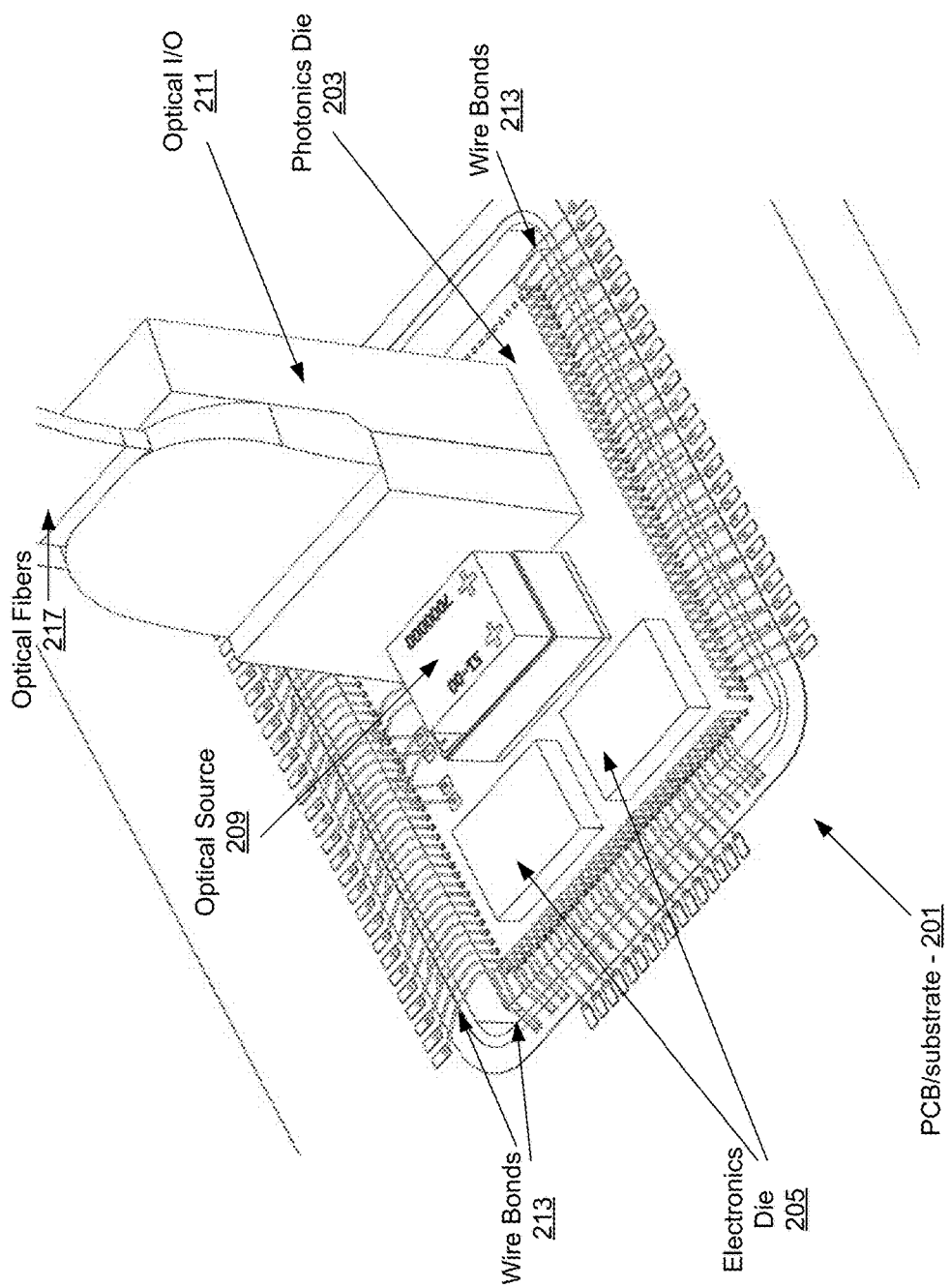
FIG. 2C is a perspective view of a hybrid integration photonic transceiver, in accordance with an embodiment of the invention.

FIG. 2C is a perspective view of a hybrid integration photonic transceiver, in accordance with an embodiment of the invention. Referring to FIG. 2C, there is shown the PCB/substrate 201, the photonics die 203, electronics die 205, the optical source assembly 209, the optical I/O 211, wire bonds 213, and optical fibers 217.

The electronics die 205 are shown bonded to the surface of the photonics die 203 via metal pillars. While two electronics die 205 are shown in FIG. 2C, it should again be noted that the invention is not so limited. Accordingly, any number of electronics die may be coupled to the photonics die 203 depending on number of transceivers, the particular CMOS node utilized, and space limitations, for example.

In an exemplary embodiment, electronic functions may be integrated into the electronics die 205 and photonics circuitry may be integrated into the photonics die 203 utilizing independent semiconductor processes. The electronics die 205 may comprise electronic devices associated with photonic devices in the photonics die 203, thereby minimizing electrical path lengths while still allowing independent performance optimization of electronic and photonic devices. Different technologies may be incorporated in the different die. For example, a Ge selective epitaxy process may be used for photodetectors in the photonics die 203, and a 32 nm CMOS process may be used for electronic devices on the electronics die 205.

The photonics die 203 may comprise photonic circuits, whereby optical signals may be received, processed, and transmitted out of the photonics die 203. The optical source assembly 209 may provide a CW optical signal to the photonics die 203 and biased by voltages coupled to the optical source assembly 209 via wire bonds 213. Photonics circuitry in the photonics die 203 may then process the CW signal. For example, the CW signal may be coupled into the photonics die 203 via grating couplers, communicated to various locations on the die via optical waveguides, modulated by MZI modulators, and communicated out of the photonics die 203 into the optical fibers 217 via the optical I/O 211. Heat may be conducted away from the die via the PCB/substrate 201. In this manner, the hybrid integration of a plurality of high performance optical transceivers is enabled in standard semiconductor processes.

Figure 3:
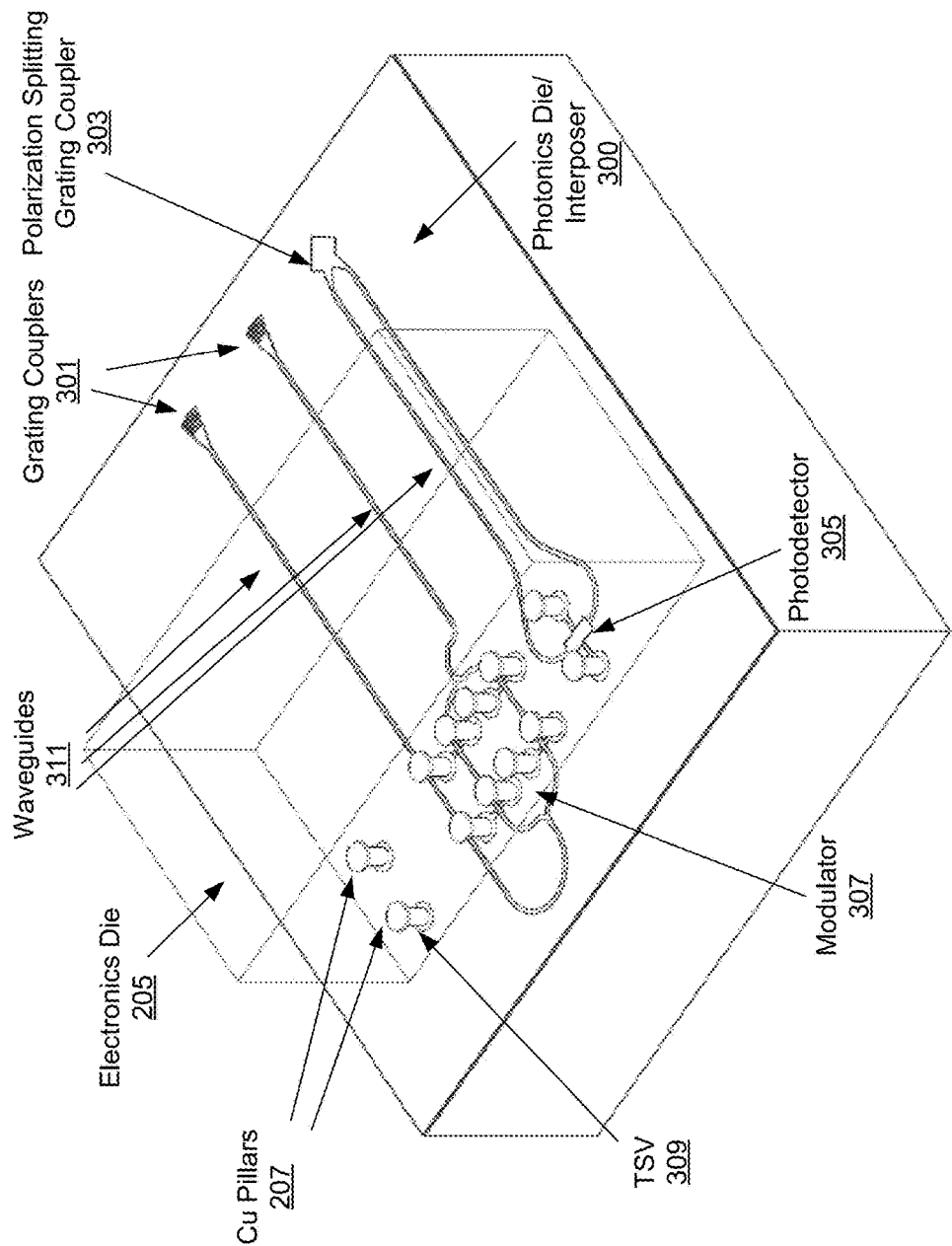
FIG. 3 is a schematic illustrating the hybrid integration of an electronics die to a photonics die, in accordance with an embodiment of the invention.

FIG. 3 is a schematic illustrating the hybrid integration of an electronics die to a photonics die, in accordance with an embodiment of the invention. Referring to FIG. 3, there is shown an electronics die 205, metal interconnects 207, and a photonics die/interposer 300. The photonics die/interposer 300 may comprise grating couplers 301, a polarization splitting grating coupler 303, a photodetector 305, an optical modulator 307, TSVs 309, and optical waveguides 311.

The metal interconnects 207 provide both electrical and mechanical coupling between the electronics die 205 and the photonics die/interposer 300. The grating couplers 301 provide for the coupling of light into and/or out of the photonics die/interposer 300. Similarly, the polarization-splitting grating coupler 303 may enable the coupling of two polarizations of light into and/or out of the photonics die/interposer 300.

The modulator 307 may comprise a MZI modulator, for example, and may be operable to modulate an optical signal based on electrical signals received from the electronics die 205 via the metal interconnects 207. In an exemplary scenario, a CW optical signal may be received from an optical source via one of the grating couplers 301, communicated via the optical waveguides 311, modulated by the optical modulator 307, communicated back by the optical waveguides 311, and out of the photonics die/interposer 300 via the other grating coupler 301.

The photodetector 305 may comprise a semiconductor photodiode, for example, and may be operable to convert a received optical signal to an electrical signal. In an exemplary scenario, optical signals with perpendicular polarizations may be received by the polarization-splitting grating coupler 303, communicated via the waveguides 311, converted to an electrical signal by the photodetector 305, with the resulting electrical signals communicated to the electronics die 205 via the metal interconnects 207. The electrical signals may be further processed by electronics in the electronics die 205 and/or communicated to other circuitry via wire bonds or the metal interconnects 207 and the TSVs 309.

The photonics die/interposer 300 comprises a silicon photonics die that may provide photonic circuits for a plurality of electronics die, thereby reducing or eliminating electrical interconnects between high-speed electronics. This may be utilized for high-speed memory access, high-speed processor interconnects, and coupling a plurality of high-speed electronics chips, for example.

Figure 4A:
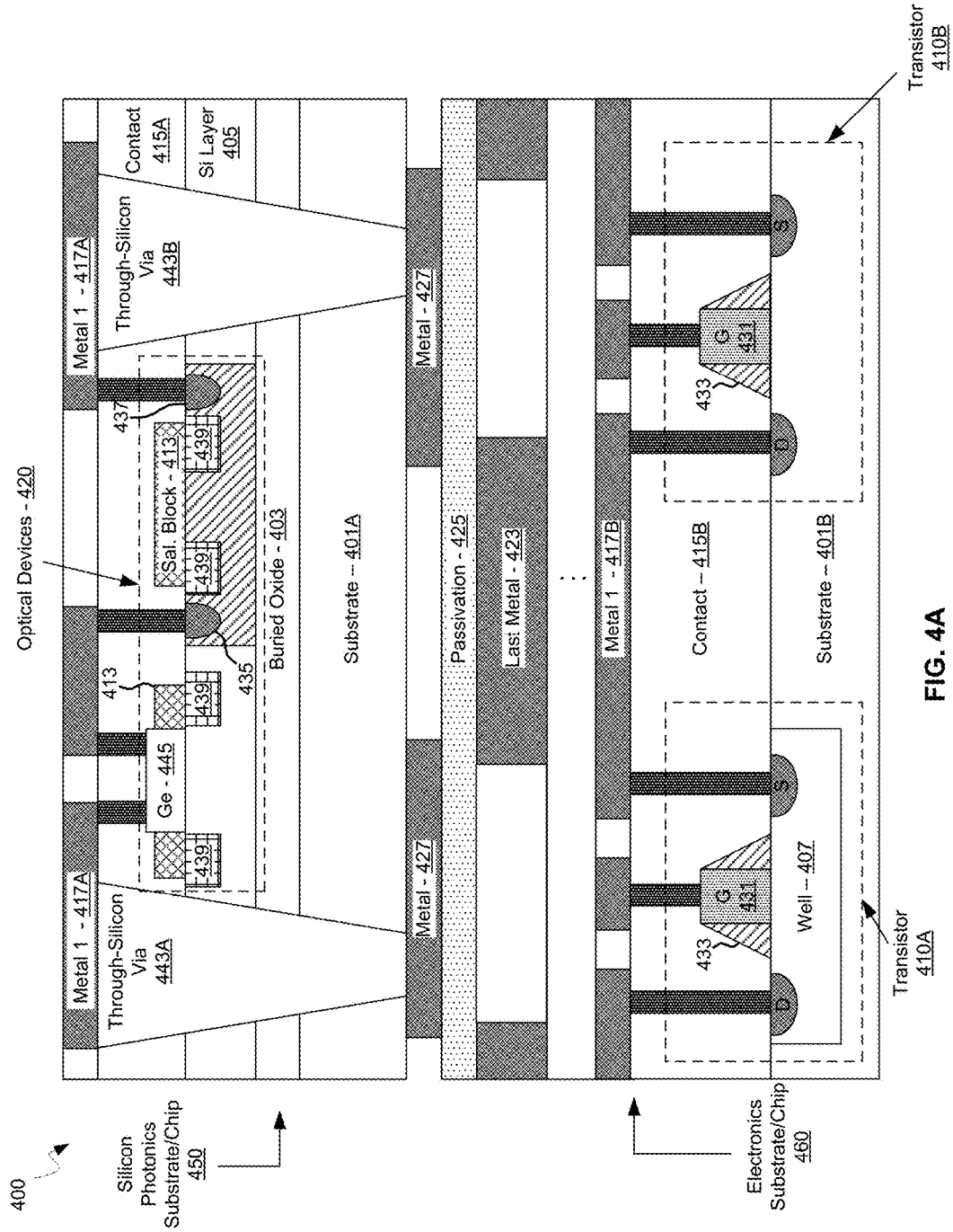
FIG. 4A is a schematic illustrating a cross-section of exemplary metal interconnect-coupled electrical and optoelectronic devices, in accordance with an embodiment of the invention.

FIG. 4A is a schematic illustrating a cross-section of exemplary metal interconnect-coupled electrical and optoelectronic devices, in accordance with an embodiment of the invention. Referring to FIG. 4A, there is shown a hybrid integrated semiconductor structure 400 comprising a silicon photonics substrate/chip/die 450, an electronics substrate/chip/die 460, and a metal layer 427 for substrate/chip physical and electrical coupling. The silicon photonics substrate/chip/die 450 comprises optical devices 420 and associated layers, and the electronics substrate/chip/die 460 comprises transistors 410A and 410B and associated layers. The layers of the die are utilized to fabricate the transistors 410A and 410B and the optical devices 420, to isolate, and to provide electrical connection to the devices, for example.

The silicon photonics substrate/chip/die 450 comprises a substrate 401A, a buried oxide 403, a Si-layer 405, a contact layer 415A, a metal 1 layer 417A, and through-silicon vias (TSVs) 443A and 443B. The optical devices 420 comprise doped and/or undoped regions of the Si-layer 405, a salicide block 413, doped contact regions 435 and 437, etched region 439, and the Ge-layer 445. The salicide block 413 comprises a layer of material to prevent the silicon of the optical devices 420 and other optical devices from being salicided during a standard CMOS process. If silicon in the optical devices was salicided, large optical losses would result. Additionally, the salicide block 413 blocks unwanted implants into the waveguides and other optical devices, which would also cause unwanted loss. The salicide block 413 may be etched to the Si-layer 405 so that the Ge-layer 445 may be deposited. The Ge-layer 445 may be utilized in a photodetector device, for example. In addition, etched regions 439 in the Si-layer 405 may be utilized for optical confinement. The etch regions 439 may be refilled with a low-k dielectric, for example, or may comprise an air gap with no refill material. Fill material may comprise silicon oxide or oxynitride materials, for example.

The silicon electronics substrate/chip/die 460 comprises a silicon substrate 401B, a well 407, a contact layer 415B, a metal 1 layer 417B, a last metal layer 423, a passivation layer 425, and the metal layer 427. The metal 1 layer 417B, the last metal layer 423, and the metal layer 427 provide electrical contact between layers and to electrical and optoelectronics devices, such as the transistors 410A and 410B and the optical devices 420. The contact layer 415 also enables electrical contact to the devices while providing electrical isolation between devices by incorporating insulating materials between conductive vias.

The transistor 410A and 410B comprises a bulk transistor with source and drain regions formed in the well 407 or the substrate 401B, respectively, from dopant implant processes, for example, as well as a gate 431, and a passivation layer 433. The gate 431 may comprise metal or polysilicon, for example, and may be isolated from the well 407 by a thin oxide layer (not shown).

In an embodiment of the invention, separate semiconductor processes may be utilized to fabricate the silicon photonics substrate/chip/die 450 and the electronics substrate/chip/die 460 so that the processes may be optimized for each type of device. In an exemplary scenario, the separate semiconductor processes may comprise different CMOS nodes, or may comprise different technologies entirely, such as CMOS and SiGe.

The wafers, or alternatively diced chips, may then be bonded together to form an optoelectronic hybrid module utilizing metal layers such as metal pillars. In this manner, layer thicknesses and doping levels may be configured for the best electronic and photonic performance in the respective structure without the tradeoffs in performance associated with fabricating electronic and photonic structures concurrently.

Figure 4B:
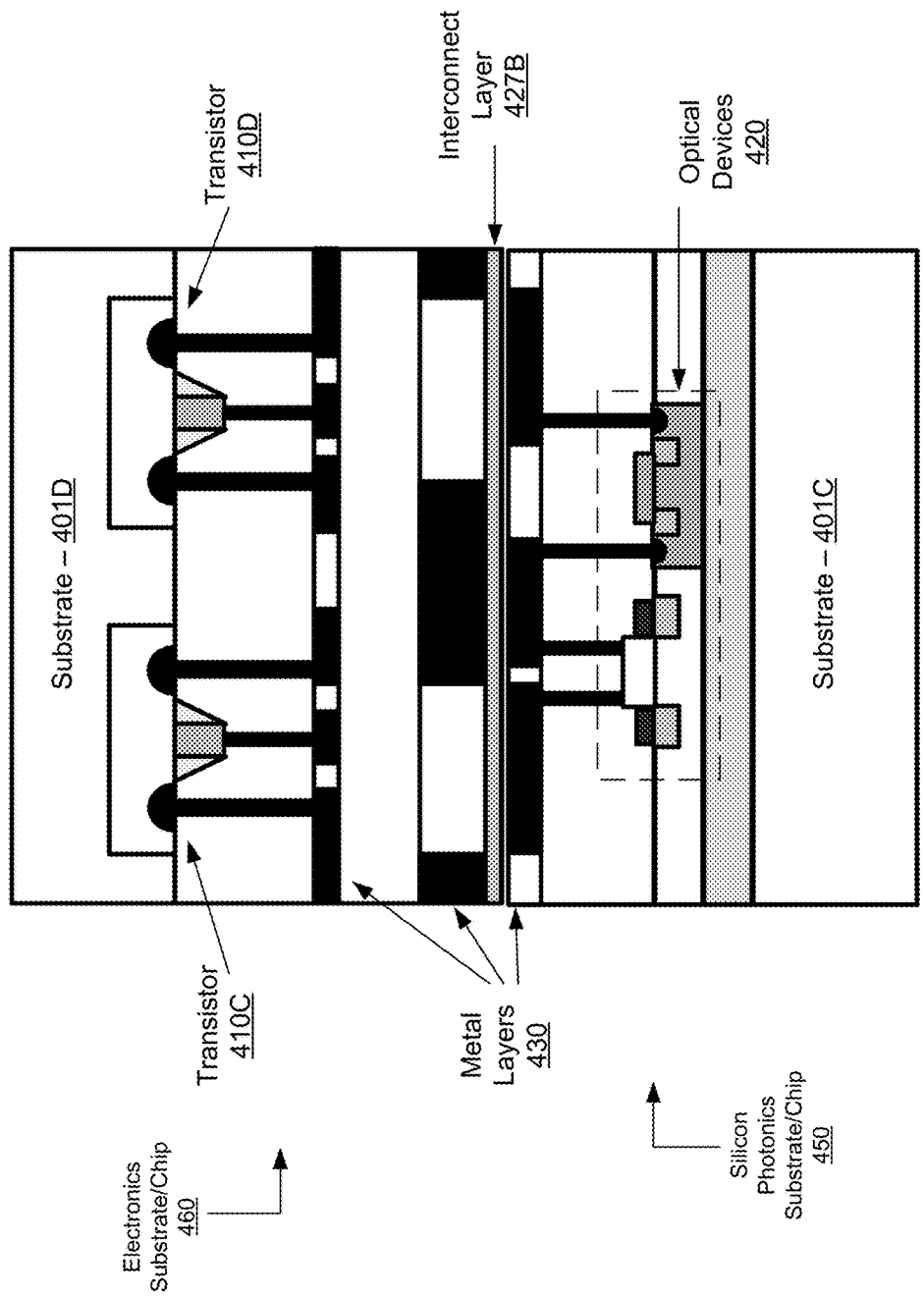
FIG. 4B is a schematic of an alternative face-to-face coupling of electronic and photonic chips, in accordance with an embodiment of the invention.

FIG. 4B is a schematic of an alternative face-to-face coupling of electronic and photonic chips, in accordance with an embodiment of the invention. Referring to FIG. 4B, there is shown the silicon photonics chip 450 and the electronics chip 460 coupled utilizing an interconnect layer 427, which may comprise metal pillars, stud bumps, or solder bumps, for example.

The silicon photonics chip 450 may comprise a substrate 401C, optical devices 420, and metal layers 430. The electronics chip 460 may comprise a substrate 401D, transistors 410C and 410D, and the metal layers 430. Each of these elements may be similar to the like-named elements of FIG. 4A.

The embodiment shown in FIG. 4B may be similar to that shown in FIG. 4A, but with the electronics and photonics chips bonded face-to-face, thereby removing the need for through-substrate-vias (TSVs).

Figure 4C:
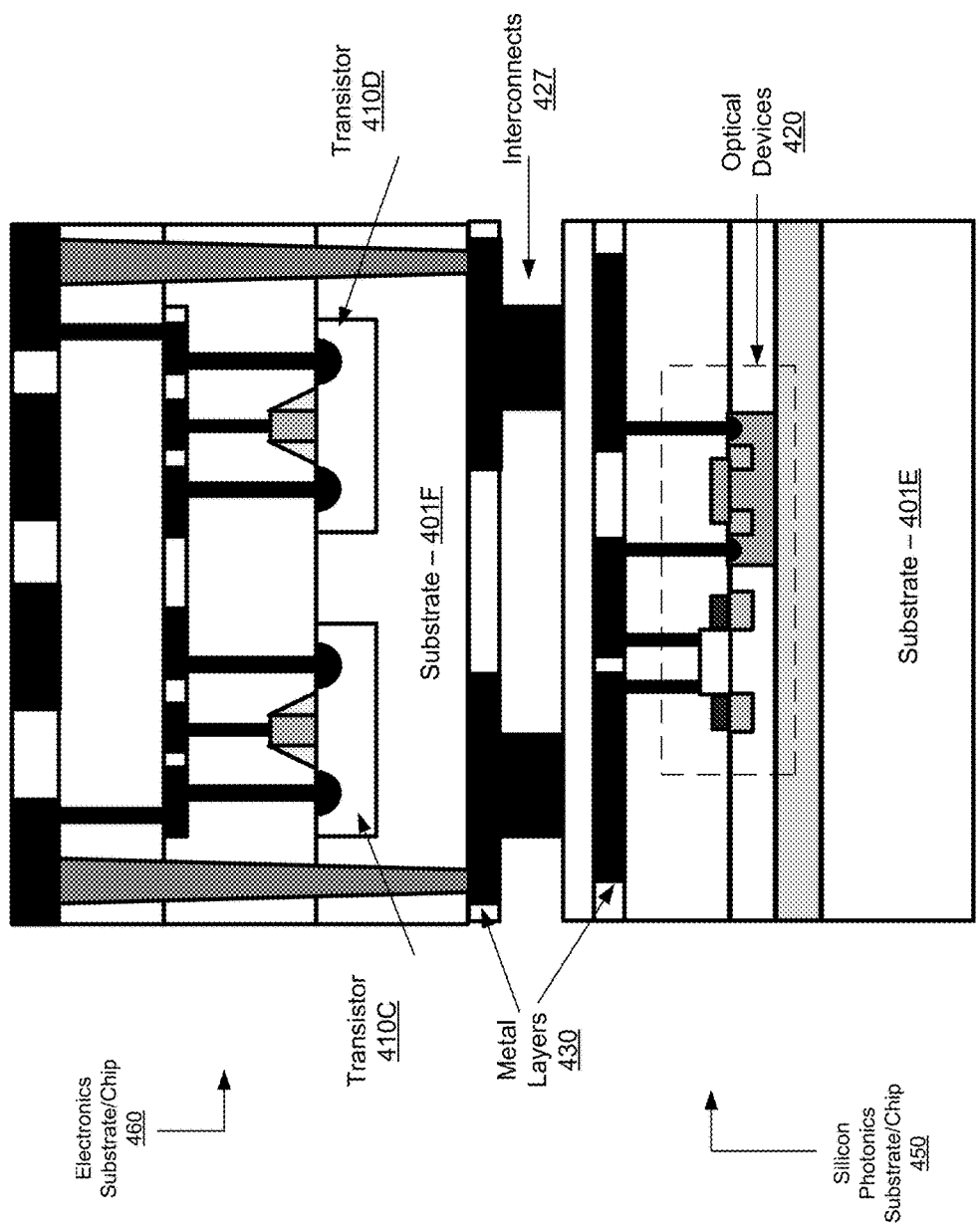
FIG. 4C is a schematic of an alternative coupling of electronic and photonic chips, in accordance with an embodiment of the invention.

FIG. 4C is a schematic of an alternative coupling of electronic and photonic chips, in accordance with an embodiment of the invention. Referring to FIG. 4C, there is shown the silicon photonics chip 450 and the electronics chip 460 coupled utilizing an interconnects 427, which may comprise metal pillars, stud bumps, or solder bumps, for example.

The silicon photonics chip 450 may comprise a substrate 401E, optical devices 420, and metal layers 430. The electronics chip 460 may comprise a substrate 401F, transistors 410C and 410D, and the metal layers 430. Each of these elements may be similar to the like-named elements of FIGS. 4A and 4B.

The embodiment shown in FIG. 4C may be similar to that shown in FIG. 4A, but with the silicon photonics chip 450 on bottom and the electronics chip 460 on top. In this scenario, the electrical contacts may be made utilizing TSVs and metal interconnects, such as metal pillars or bumps.

Figure 5:
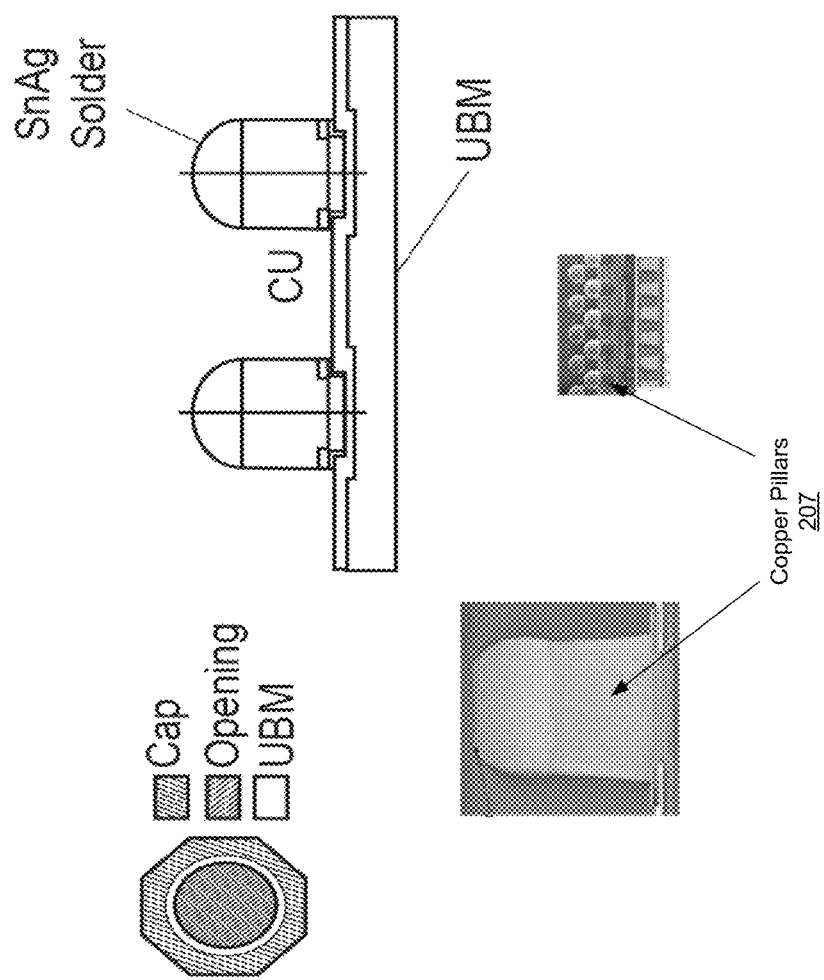
FIG. 5 is a diagram illustrating exemplary metal pillars for coupling electrical and photonics die, in accordance with an embodiment of the invention.

FIG. 5 is a diagram illustrating exemplary metal interconnects for coupling electrical and photonics die, in accordance with an embodiment of the invention. Referring to FIG. 5, there is shown cross-section and perspective views of the metal interconnects 207. The exemplary copper pillars shown comprise widths on the order of 50 microns, but smaller diameters may be utilized for reduced parasitic capacitance. In addition, a tin/silver cap layer may be utilized for mechanical bonding and electrical contact, i.e. soldering. The dimensions of the metal interconnects may be adjusted based on speed requirements, device density, thermal properties, and capacitance and electrical resistance requirements, for example.

In an embodiment of the invention, a method and system are disclosed for hybrid integration of optical communication systems. In this regard, receiving one or more continuous wave (CW) optical signals in a silicon photonics die 203/300 from an optical source 209 external to the silicon photonics die 203/300. The one or more received CW optical signals may be processed based on electrical signals received from one or more electronics die 205 bonded to the silicon photonics die 203/300 via metal interconnects 207.

Modulated optical signals may be received in the photonics die 203/300 from one or more optical fibers 217 coupled to the silicon photonics die 203/300. Electrical signals may be generated in the silicon photonics die 203/300 based on the received modulated optical signals and communicated to the one or more electronics die 205 via the metal interconnects 207. The metal interconnects 207 may comprise copper pillars, for example. The one or more CW optical signals may be received from an optical source assembly 209 coupled to the silicon photonics die 203/300 and/or from one or more optical fibers 217 coupled to the silicon photonics die 203/300.

The one or more received CW optical signals may be processed utilizing one or more optical modulators 105A-105D/307, which may comprise Mach-Zehnder interferometer modulators, for example. The electrical signals may be generated in the silicon photonics die 203/300 utilizing one or more photodetectors 111A-111D/305 integrated in the silicon photonics die 203/300. The optical signals may be communicated into and/or out of the silicon photonics die 203/300 utilizing grating couplers 117A-117H/301/303. The optical source 209 may comprise one or more semiconductor lasers 101. The hybrid integration optical communication system 100 may comprise a plurality of transceivers 105/112/117/107/111 (A-F).

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for communication, the method comprising:
in an optical communication system comprising a silicon photonics die and one or more electronics die bonded to said silicon photonics die utilizing metal interconnects:
receiving one or more continuous wave (CW) non-modulated optical signals in said silicon photonics die from an optical source external to said silicon photonics die;
modulating said one or more received CW non-modulated optical signals in said silicon photonics die using electrical signals received from said one or more electronics die via said metal interconnects;
receiving modulated optical signals in said silicon photonics die;
generating electrical signals in said silicon photonics die based on said received modulated optical signals; and
communicating said generated electrical signals to at least one of said one or more electronics die via said metal interconnects.

2. The method according to claim 1, wherein said metal interconnects comprise copper pillars.

3. The method according to claim 1, comprising receiving said one or more CW non-modulated optical signals from an optical source assembly coupled to said silicon photonics die.

4. The method according to claim 1, comprising receiving said one or more CW non-modulated optical signals from one or more optical fibers coupled to said silicon photonics die.

5. The method according to claim 1, comprising modulating said one or more received CW non-modulated optical signals utilizing one or more optical modulators integrated in said silicon photonics die.

6. The method according to claim 5, wherein said one or more optical modulators comprise Mach-Zehnder interferometer modulators.

7. The method according to claim 1, comprising generating said electrical signals in said silicon photonics die utilizing one or more photodetectors integrated in said silicon photonics die.

8. The method according to claim 1, comprising communicating optical signals into and/or out of said silicon photonics die utilizing grating couplers.

9. The method according to claim 1, wherein said optical source comprises one or more semiconductor lasers.

10. The method according to claim 1, wherein said optical communication system comprises a plurality of transceivers.

11. A system for communication, the system comprising:
an optical communication system comprising a silicon photonics die and one or more electronics die bonded to said silicon photonics die utilizing metal interconnects, said optical communication system being operable to:
receive one or more continuous wave (CW) non-modulated optical signals in said silicon photonics die from an optical source external to said silicon photonics die;
modulate said one or more received CW non-modulated optical signals in said silicon photonics die using electrical signals received from said one or more electronics die via said metal interconnects;
receive modulated optical signals in said silicon photonics die;
generate electrical signals in said silicon photonics die based on said received modulated optical signals; and
communicate said generated electrical signals to at least one of said one or more electronics die via said metal interconnects.

12. The system according to claim 11, wherein said metal interconnects comprise copper pillars.

13. The system according to claim 11, wherein said optical communication system is operable to receive said one or more CW non-modulated optical signals from an optical source assembly coupled to said silicon photonics die.

14. The system according to claim 11, wherein said optical communication system is operable to receive said one or more CW non-modulated optical signals from one or more optical fibers coupled to said silicon photonics die.

15. The system according to claim 11, wherein said optical communication system is operable to modulate said one or more received CW non-modulated optical signals utilizing one or more optical modulators integrated in said silicon photonics die.

16. The system according to claim 15, wherein said one or more optical modulators comprise Mach-Zehnder interferometer modulators.

17. The system according to claim 11, wherein said optical communication system is operable to generate said electrical signals in said silicon photonics die utilizing one or more photodetectors integrated in said silicon photonics die.

18. The system according to claim 11, wherein said optical communication system is operable to communicate optical signals into and/or out of said silicon photonics die utilizing grating couplers.

19. The system according to claim 11, wherein said optical source comprises one or more semiconductor lasers.

20. A system for communication, the system comprising:
an optical communication system comprising a silicon photonics die and one or more electronics die bonded to said silicon photonics die utilizing metal pillars, said optical communication system being operable to:
receive one or more continuous wave (CW) non-modulated optical signals in said silicon photonics die from an optical source external to said silicon photonics die;
modulate said one or more received CW non-modulated optical signals based on electrical signals received from said one or more electronics die via said metal pillars;
receive modulated optical signals in said silicon photonics die;
generate electrical signals utilizing photodetectors in said silicon photonics die based on said received modulated optical signals; and
communicate said generated electrical signals to said one or more electronics die via said metal pillars.

* * * * *